(12) United States Patent
Chen et al.

(10) Patent No.: US 9,129,816 B2
(45) Date of Patent: Sep. 8, 2015

(54) CONTACT TEST STRUCTURE AND METHOD

(75) Inventors: Jie Chen, New Taipei (TW); Hsien-Wei Chen, Hsin-Chu (TW); Tsung-Yuan Yu, Taipei (TW); Ying-Ju Chen, Tuku Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 297 days.

(21) Appl. No.: 13/422,846

(22) Filed: Mar. 16, 2012

(65) Prior Publication Data

US 2013/0240883 A1    Sep. 19, 2013

(51) Int. Cl.
*H01L 21/66* (2006.01)
*H01L 23/00* (2006.01)
*H01L 23/482* (2006.01)

(52) U.S. Cl.
CPC .............. *H01L 24/06* (2013.01); *H01L 22/30* (2013.01); *H01L 22/34* (2013.01); *H01L 23/4824* (2013.01); *H01L 22/32* (2013.01); *H01L 24/05* (2013.01); *H01L 24/13* (2013.01); *H01L 2224/0345* (2013.01); *H01L 2224/03452* (2013.01); *H01L 2224/0401* (2013.01); *H01L 2224/05008* (2013.01); *H01L 2224/05124* (2013.01); *H01L 2224/05144* (2013.01); *H01L 2224/05147* (2013.01); *H01L 2224/05166* (2013.01); *H01L 2224/05541* (2013.01); *H01L 2224/05555* (2013.01); *H01L 2224/05569* (2013.01); *H01L 2224/05572* (2013.01); *H01L 2224/05583* (2013.01); *H01L 2224/05647* (2013.01); *H01L 2224/05655* (2013.01); *H01L 2224/05666* (2013.01); *H01L 2224/13006* (2013.01); *H01L 2224/13022* (2013.01); *H01L 2224/13111* (2013.01); *H01L 2224/13139* (2013.01); *H01L 2224/13147* (2013.01); *H01L 2224/14153* (2013.01); *H01L 2224/14155* (2013.01)

(58) Field of Classification Search
CPC ................................ H01L 22/00; H01L 22/30
See application file for complete search history.

(56) References Cited

U.S. PATENT DOCUMENTS

| | | | |
|---|---|---|---|
| 2009/0033346 A1* | 2/2009 | Wu et al. | 324/754 |
| 2010/0148812 A1* | 6/2010 | Nagai et al. | 324/754 |
| 2011/0198748 A1* | 8/2011 | Koike | 257/737 |

* cited by examiner

*Primary Examiner* — Cheung Lee
(74) *Attorney, Agent, or Firm* — Slater & Matsil, L.L.P.

(57) ABSTRACT

A system and method for testing electrical connections is provided. In an embodiment one or more floating pads may be manufactured in electrical connection with an underbump metallization structure. A test may then be performed to measure the electrical characteristics of the underbump metallization structure through the floating pad in order to test for defects. Alternatively, a conductive connection may be formed on the underbump metallization and the test may be performed on the conductive connection and the underbump metallization together.

18 Claims, 7 Drawing Sheets

CONTACT TEST STRUCTURE AND METHOD

BACKGROUND

Generally, a semiconductor die may be attached to a substrate such as a printed circuit board (or even attached to another semiconductor die or a semiconductor wafer) using an electrical connector between the semiconductor die and the substrate. The electrical connector may be physically and electrically connected to the semiconductor die using, e.g., an underbump metallization. This underbump metallization may provide a point of electrical contact so that the electrical signals applied to the electrical connector between the semiconductor die and the substrate have an electrical path to the semiconductor structures located within the interior of the semiconductor die.

However, the placement of the electrical connector and its electrical connection to the underbump metallization may not be perfect. Issues related to the placement may occur due to a misalignment of the electrical connector with the underbump metallization, cracks that may occur within the electrical connector or the underbump metallization, delamination of the underbump metallization, and a whole host of other issues. If these issues arise, there may be a complete or partial loss of electrical contact between the electrical connector and the underbump metallization. Such a loss can lead to a complete or partial failure of the electrical connector to transmit signals, power, or ground connections to the semiconductor die and may lead to a total or partial loss of the utility of the semiconductor die, as it may not be able to function as desired with the problems that may arise. As such, problems between the electrical connector and the underbump metallization may lead to a discarding of the semiconductor die and need to completely remanufacture the semiconductor die in order to obtain a usable semiconductor device that performs that desired function.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provides many applicable concepts that can be embodied in a wide variety of specific contexts. The specific embodiments discussed are merely illustrative of specific ways to make and use the embodiments, and do not limit the scope of the embodiments.

The embodiments will be described with respect to embodiments in a specific context, namely a solder ball connection for a semiconductor die. The embodiments may also be applied, however, to other types of electrical connections.

Figure 1:
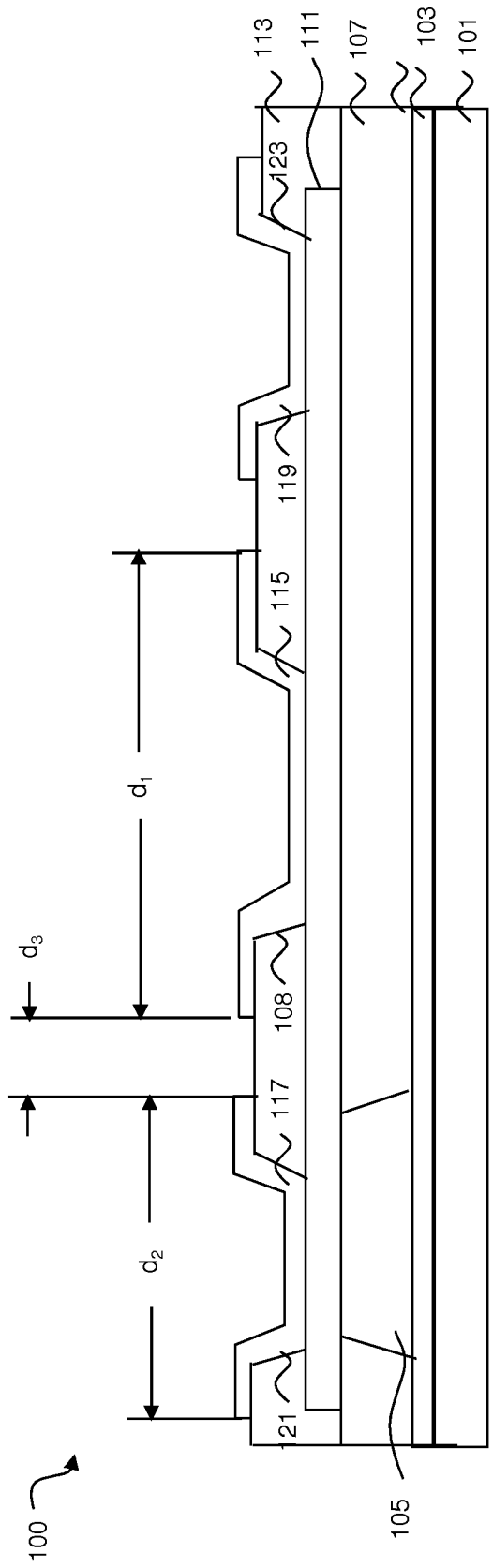
FIG. 1 illustrates a semiconductor die with an underbump metallization, a first floating pad and a second floating pad in accordance with an embodiment.

With reference now to FIG. 1, there is shown a portion of a semiconductor die 100 including a semiconductor substrate 101 with metallization layers 103, a contact pad 105, a first passivation layer 107, a post-passivation interconnect (PPI) 111, a second passivation layer 113, an underbump metallization (UBM) 115, a first floating pad 117, and a second floating pad 119. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Active devices (not shown) may be formed on the semiconductor substrate 101. As one of ordinary skill in the art will recognize, a wide variety of active devices such as capacitors, resistors, inductors and the like may be used to generate the desired structural and functional requirements of the design for the semiconductor die 100. The active devices may be formed using any suitable methods either within or else on the surface of the semiconductor substrate 101.

The metallization layers 103 are formed over the semiconductor substrate 101 and the active devices and are designed to connect the various active devices to form functional circuitry. While illustrated in FIG. 1 as a single layer, the metallization layers 103 may be formed of alternating layers of dielectric (e.g., low-k dielectric material) and conductive material (e.g., copper) and may be formed through any suitable process (such as deposition, damascene, dual damascene, etc.). In an embodiment there may be four layers of metallization separated from the semiconductor substrate 101 by at least one interlayer dielectric layer (ILD), but the precise number of metallization layers 103 is dependent upon the design of the semiconductor die 100.

The contact pad 105 may be formed over and in electrical contact with the metallization layers 103. The contact pad 105 may comprise aluminum, but other materials, such as copper, may alternatively be used. The contact pad 105 may be formed using a deposition process, such as sputtering, to form a layer of material (not shown) and portions of the layer of material may then be removed through a suitable process (such as photolithographic masking and etching) to form the contact pad 105. However, any other suitable process may be utilized to form the contact pad 105. The contact pad 105 may be formed to have a thickness of between about 0.5 μm and about 4 μm, such as about 1.45 μm.

The first passivation layer 107 may be formed on the semiconductor substrate 101 over the metallization layers 103 and the contact pad 105. The first passivation layer 107 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 107 may be formed through a process such as chemical vapor deposition (CVD), although any suitable process may be utilized, and may have a thickness between about 0.5 μm and about 5 μm, such as about 9.25 KÅ.

After the first passivation layer 107 has been formed, portions of the first passivation layer 107 may be removed to expose at least a portion of the underlying contact pad 105. Exposing the contact pad 105 allows for contact between the contact pad 105 and the PPI 111 (discussed further below). The contact pad 105 may be exposed using a suitable removal process such as a chemical mechanical planarization (CMP) process or a photolithographic mask and etching process. However, any suitable process to expose portions of the contact pad 105 may alternatively be used.

After the contact pad 105 has been exposed, the PPI 111 may be formed in electrical contact with the contact pad 105 and may be formed to extend along the first passivation layer 107. The PPI 111 may be utilized as a redistribution layer to allow the UBM 115 that is electrically connected to the contact pad 105 to be placed in any desired location on the semiconductor die 100, instead of limiting the location of the UBM 115 to the region directly over the contact pad 105. Additionally, the PPI 111 may be formed to provide a circuit path between the UBM 115, the first floating pad 117 and the second floating pad 119 (discussed further below).

In an embodiment the PPI 111 may be formed by initially forming a seed layer (not individually shown in FIG. 1) of a titanium copper alloy through a suitable formation process such as CVD or sputtering. A photoresist (not shown) may then be formed to cover the seed layer, and the photoresist may be patterned to expose those portions of the seed layer that are located where the PPI 111 is desired to be located.

Once the photoresist has been formed and patterned, a conductive material, such as copper, may be formed on the seed layer through a deposition process such as plating. The conductive material may be formed to have a thickness of between about 1 μm and about 10 μm, such as about 5 μm, and a width along the first passivation layer 107 of between about 5 μm and about 300 μm, such as about 15 μm. However, while the material and methods discussed are suitable to form the conductive material, these materials are merely exemplary. Any other suitable materials, such as AlCu or Au, and any other suitable processes of formation, such as CVD or PVD, may alternatively be used to form the PPI 111.

Once the conductive material has been formed, the photoresist may be removed through a suitable removal process such as ashing, whereby the temperature of the photoresist is increased until the photoresist decomposes and may be removed. Additionally, after the removal of the photoresist, those portions of the seed layer that were covered by the photoresist may be removed through, for example, a suitable etch process using the conductive material as a mask.

Once the PPI 111 has been formed, the second passivation layer 113 may be formed to protect the PPI 111 and the other underlying structures. The second passivation layer 113 may be formed from a polymer such as polyimide, or may alternatively be formed of a similar material as the first passivation layer 107 (e.g., silicon oxides, silicon nitrides, low-k dielectrics, extremely low-k dielectrics, combinations of these, and the like). The second passivation layer 113 may be formed to have a thickness of between about 2 μm and about 15 μm, such as about 5 μm.

After the second passivation layer 113 has been formed, a contact opening 108, a first floating pad opening 121, and a second floating pad opening 123 may be made through the second passivation layer 113 by removing portions of the second passivation layer 113 to expose portions of the underlying PPI 111. The contact opening 108 allows for contact between the UBM 115 and the PPI 111, the first floating pad opening 121 allows for contact between the first floating pad 117 and the PPI 111, and the second floating pad opening 123 allows for contact between the second floating pad 119 and the PPI 111 (discussed further below with respect to FIG. 3). The contact opening 108, the first floating pad opening 121, and the second floating pad opening 123 may be formed using a suitable photolithographic mask and etching process, although any suitable process to form the contact opening 108, the first floating pad opening 121, and the second floating pad opening 123 may alternatively be used.

Once the PPI 111 has been exposed through the second passivation layer 113, the UBM 115, the first floating pad 117, and the second floating pad 119 may be formed in electrical contact with the PPI 111. The UBM 115, the first floating pad 117, and the second floating pad 119 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM 115, the first floating pad 117 and the second floating pad 119. Any suitable materials or layers of material that may be used for the UBM 115, the first floating pad 117, and the second floating pad 119 are fully intended to be included within the scope of the embodiments.

The UBM 115, the first floating pad 117, and the second floating pad 119 may be created by forming each layer over the second passivation layer 113 and along the interior of the contact opening 108, the first floating pad opening 121, and the second floating pad opening 123, respectively. The forming of each layer may be performed using a plating process, such as electrochemical plating, although other processes of formation, such as sputtering, evaporation, or PECVD process, may alternatively be used depending upon the desired materials. The UBM 115, the first floating pad 117, and the second floating pad 119 may be formed to have a thickness of between about 0.7 μm and about 10 μm, such as about 5 μm. Once the desired layers have been formed, portions of the layers may then be removed through a suitable photolithographic masking and etching process to remove the undesired material and to leave the UBM 115, the first floating pad 117 and the second floating pad 119 in a desired shape, such as a circular, octagonal, square, or rectangular shape, although any desired shape may alternatively be formed.

In an embodiment the UBM 115 may be formed in a circular shape and may have a first diameter $d_1$ of between about 150 μm and about 300 μm, such as about 240 μm. The first floating pad 117 and the second floating pad 119 may also be formed in a circular shape and may have a second diameter $d_2$ that may be greater than about 15 μm while also being less than or equal to the first diameter $d_1$. By forming the first floating pad 117 and the second floating pad 119 to have identical or smaller dimensions than the UBM 115, valuable real estate on the semiconductor die 100 may be saved, allowing for a smaller and more efficient semiconductor die to be manufactured.

For example, for a flip chip or WLCSP product, the chip area size is limited while the number of bumps and their respective UBMs is expected to be large enough to fulfill all I/O functions. If the first floating pad 117 and the second floating pad 119 are large, the designer may sacrifice space for bumps. However, by keeping the first floating pad 117 and the second floating pad 119 to have a similar or smaller dimensions than the UBM 115, the designer may have more space and more flexibility in the placement of the UBMs 115 and their respective bumps.

For example, in an embodiment in which the UBM 115 has a circular shape with a the first diameter $d_1$ being 240 µm, the first floating pad 117 and the second floating pad 119 may be formed in a circular shape with the second diameter $d_2$ being between about 15 µm and about 240 µm. In an alternative embodiment, the first floating pad 117 and the second floating pad 119 may be shaped as squares, with each square having an equal length and width of between about 10 µm and about 200 µm, such as about 50 µm.

The first floating pad 117 (and the second floating pad 119 on an opposing side of the UBM 115) may be separated from the UBM 115 in order to have the current pass through the PPI 111 during testing. In an embodiment the first floating pad 117 and the second floating pad 119 on the opposing side of the UBM 115 may be separated from the UBM 115 by a first distance $d_3$ of greater than about 10 µm, such as between about 10 µm and about 100 µm. However, these dimensions are intended to be illustrative and not limiting, as any suitable shape and size may alternatively be used.

However, as one of ordinary skill in the art will recognize, while the above description describes a process in which the UBM 115, the first floating pad 117, and the second floating pad 119 are formed at the same time using the same processes and the same materials, this is intended to be merely an illustrative embodiment and is not intended to limit the embodiments. Any suitable combination of process and materials, such as forming the UBM 115 in a separate process and from different materials from the first floating pad 117 and the second floating pad 119, may alternatively be utilized. These and all other combinations are fully intended to be included within the scope of the embodiments.

Figure 2:
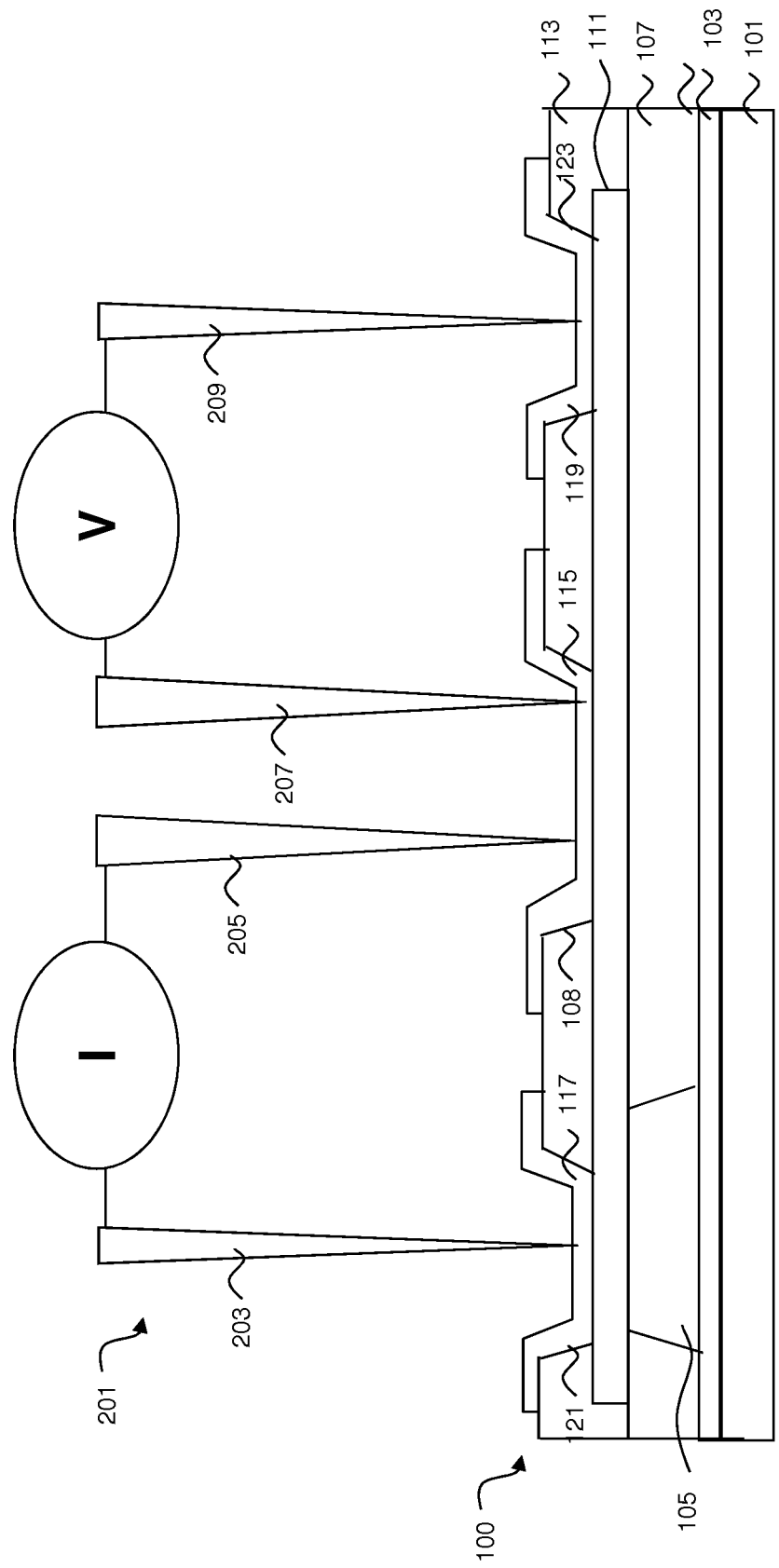
FIG. 2 illustrates a test apparatus that may be used to test the underbump metallization with the first floating pad and the second floating pad in accordance with an embodiment.

FIG. 2 illustrates a test of the electrical properties of the UBM 115 and the PPI 111 utilizing the first floating pad 117 and the second floating pad 119. In an embodiment the test may be performed using a test apparatus 201 that comprises a first terminal 203, a second terminal 205, a third terminal 207, and a fourth terminal 209. In an embodiment the first terminal 203 may be placed in contact with the first floating pad 117 and the second terminal 205 may be placed in contact with the UBM 115, thereby completing a circuit from the second terminal 205 through the UBM 115, the PPI 111, the first floating pad 117, and back to the first terminal 203. Additionally, the third terminal 207 may be placed in contact with the UBM 115 while the fourth terminal 209 may be placed in contact with the second floating pad 119, thereby completing a circuit from the third terminal 207, through the UBM 115, the PPI 111, the second floating pad 119, and back to the fourth terminal 209.

With these connections, a current may be applied to the second terminal 205 (connected to the UBM 115) and the current's change through the UBM 115, the PPI 111, and the first floating pad 117 may received by the first terminal 203 and measured by the test apparatus 201. Similarly, a voltage may be applied to the third terminal 207 (connected to the UBM 115) and the voltage's change through the UBM 115, the PPI 111, and the second floating pad 119 may be received by the fourth terminal 209 and measured by the test apparatus 201. The changes of the current and the voltage between the UBM 115 and the first floating pad 117 and the second floating pad 119, respectively, may then be analyzed to determine if there is a defect within the UBM 115 or the PPI 111 that may affect the overall electrical performance of the UBM 115 and the PPI 111. If a defect has occurred, processing may be stopped in order to avoid additional costs.

However, as one of ordinary skill in the art will recognize, the four terminal test utilizing two floating pads (the first floating pad 117 and the second floating pad 119) to measure both current and voltage is merely one embodiment and is not intended to limit the embodiments. Any suitable test using any number of floating pads, such as using only the first floating pad 117 and not manufacturing the second floating pad 119, or, alternatively, manufacturing and using additional floating pads in addition to the first floating pad 117 and the second floating pad 119, may alternatively be utilized. Any combination of the number of floating pads, the number of terminals, and the desired tests to be run on the UBM 115 and the PPI 111 are fully intended to be included within the scope of the embodiments.

Figure 3:
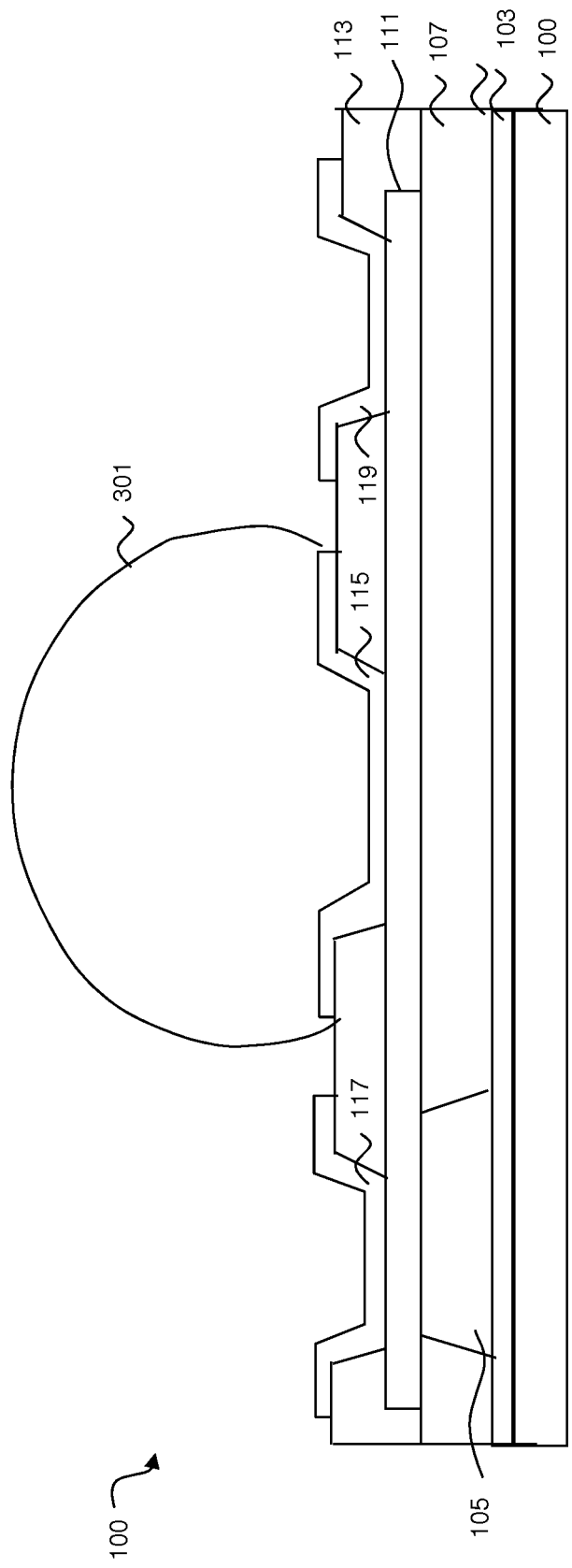
FIG. 3 illustrates a formation of a first contact connection in accordance with an embodiment.

FIG. 3 illustrates a placement of a first contact connector 301 onto the UBM 115. The first contact connector 301 may be, e.g., a contact bump and may comprise a material such as tin, or other suitable materials, such as silver, lead-free tin, or copper. In an embodiment in which the first contact connector 301 is a tin solder bump, the first contact connector 301 may be formed by initially forming a layer of tin through such commonly used methods such as evaporation, electroplating, printing, solder transfer, ball placement, etc, to a thickness of, e.g., about 100 µm. Once a layer of tin has been formed on the structure, a reflow may be performed in order to shape the material into the desired bump shape.

However, the described embodiments are not intended to be limited to a contact bump as described above. Any other suitable contact connection, such as a copper connection, a conductive pillar (such as a copper pillar), or any other type of connection may alternatively be utilized. All suitable connections are fully intended to be included within the scope of the embodiments.

Figure 4A:
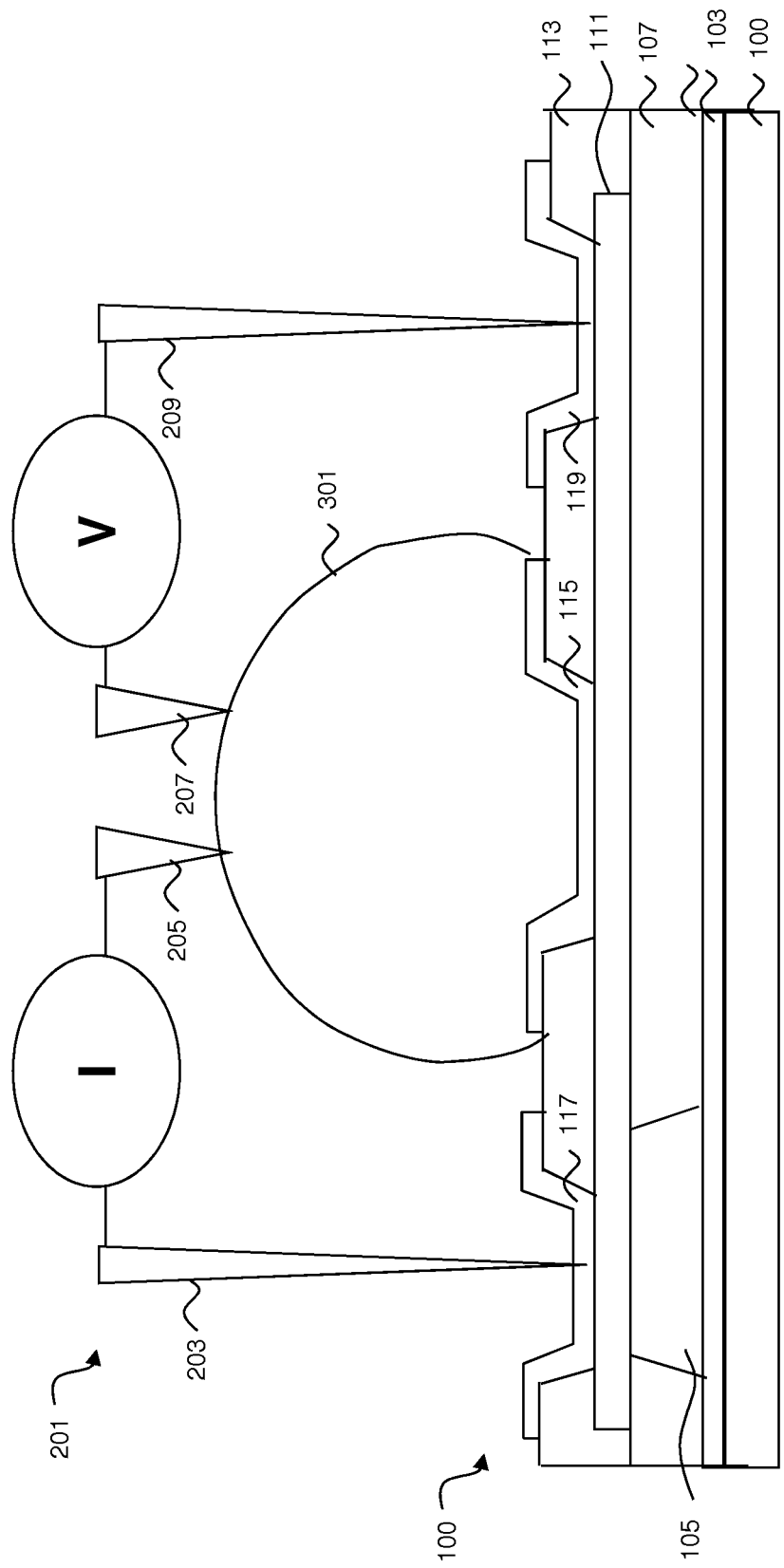
FIGS. 4A-4B illustrates a test apparatus that may be used to test the first contact connection with the first floating pad and the second floating pad in accordance with an embodiment.

FIG. 4A illustrates a testing of the first contact connector 301, the UBM 115, and the PPI 111 utilizing the first terminal 203, the second terminal 205, the third terminal 207 and the fourth terminal 209 of the test apparatus 201 described above with respect to FIG. 2. In an embodiment the first contact connector 301, the UBM 115, and the PPI 111 may be tested by placing the second terminal 205 and the third terminal 207 in electrical contact with the first contact connector 301, placing the first terminal 203 in electrical contact with the first floating pad 117, and by placing the fourth terminal 209 in electrical contact with the second floating pad 119. By making these connections, a circuit may be formed from the second terminal 205, the first contact connector 301, the UBM 115, the PPI 111, the first floating pad 117, and to the first terminal 203. Similarly, another circuit may be formed from the third terminal 207, the first contact connector 301, the UBM 115, the PPI 111, the second floating pad 119, and to the fourth terminal 209.

With these connections, a current may be applied to the second terminal 205 and its change through the first contact connector 301, the UBM 115, the PPI 111, and the first floating pad 117 to the first terminal 203 may be measured by the test apparatus 201. Similarly, a voltage may be applied to the third terminal 207 and its change through the first contact connector 301, the UBM 115, the PPI 111, and the second floating pad 119 to the fourth terminal 209 and may be measured by the test apparatus 201. The changes between the current and the voltage between the first contact connector 301 and the first floating pad 117 and the second floating pad 119, respectively, may then be analyzed to determine if there is a defect within the first contact connector 301, the UBM 115, or the PPI 111 that may affect the overall electrical performance of the first contact connector 301, the UBM 115, and the PPI 111. If a defect has occurred, processing may be stopped in order to avoid additional costs.

However, as one of ordinary skill in the art will recognize and similar to the embodiment discussed above with respect to FIG. 2, the four terminal test utilizing two floating pads (the first floating pad 117 and the second floating pad 119) to measure both current and voltage is merely one embodiment and is not intended to be limiting on the embodiments. Any suitable test using any number of floating pads, such as using only the first floating pad 117 and not manufacturing the second floating pad 119, or, alternatively, manufacturing and using additional floating pads in addition to the first floating pad 117 and the second floating pad 119, may alternatively be utilized. Any combination of the number of floating pads and the desired tests to be run on the first contact connector 301 and the UBM 115 are fully intended to be included within the scope of the embodiments.

Figure 4B:
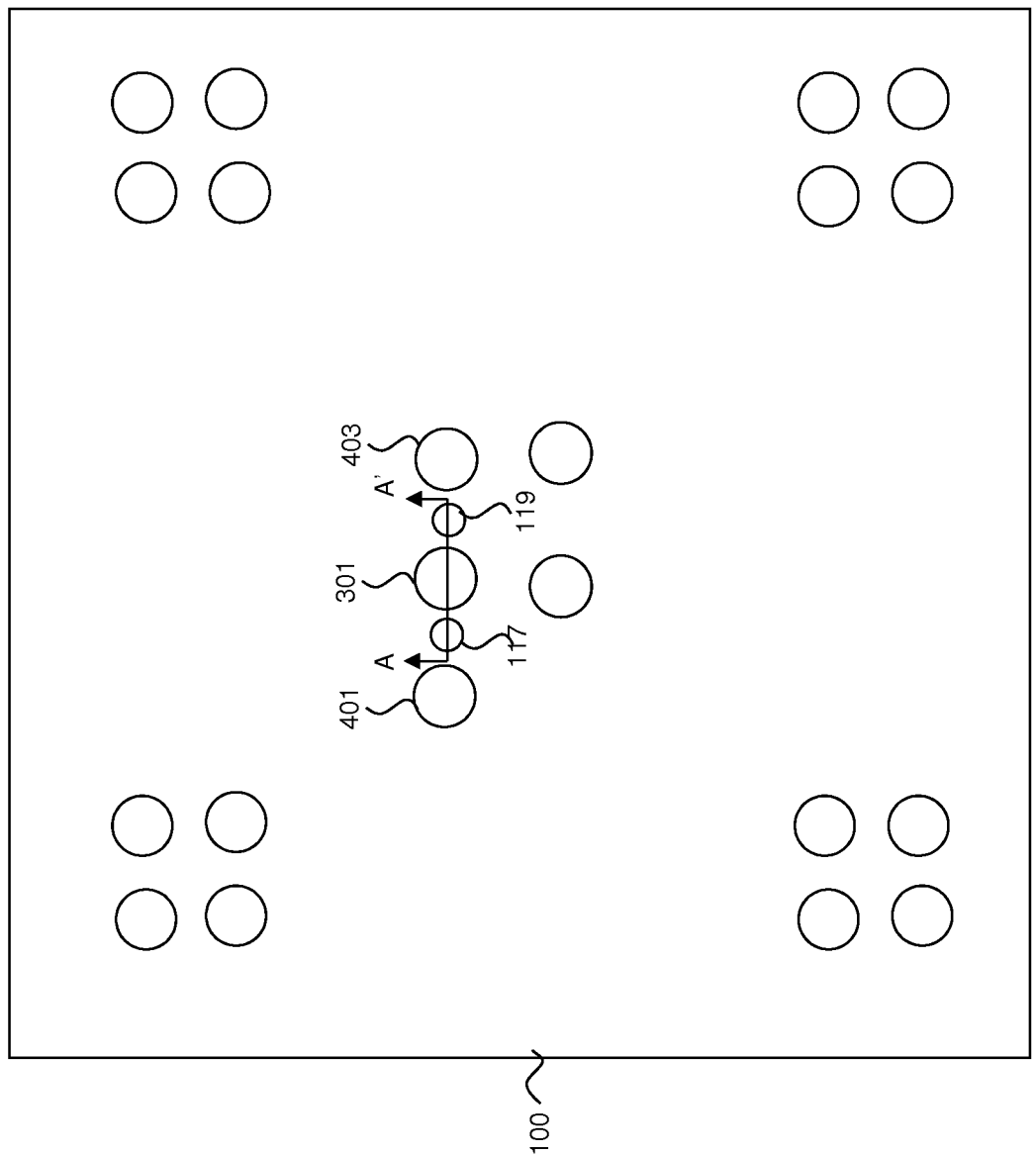

FIG. 4B illustrates a top down view of a layout that may be utilized to place the first contact connector 301, the first floating pad 117, and the second floating pad 119 onto a center region of the semiconductor die 100, with the cross-sectional view illustrated in FIG. 4A being indicated along line A-A'. The array may be utilized to connect the semiconductor die 100 to an external device, such as a wafer, in, e.g., a wafer level chip scale packaging architecture. However, any suitable arrangement for any suitable type of connection to external devices, such as flip-chip architectures or other architectures, may alternatively be used.

In the embodiment illustrated in FIG. 4B in which the first contact connector 301 is a contact bump, the first contact connector 301 may be placed into a ball grid array and may be linearly arranged with a second contact connector 401 and a third contact connector 403. The second contact connector 401 and the third contact connector 403 may be similar to the first contact connector 301 and may be, e.g., contact bumps.

In this embodiment the first floating pad 117 may be placed between the first contact connector 301 and the second contact connector 401 and may be aligned along the same linear direction as the first contact connector 301, the second contact connector 401, and the third contact connector 403 are aligned. Similarly, the second floating pad 119 may be placed between the first contact connector 301 and the third contact connector 403, and may be aligned along the same linear direction as the first contact connector 301, the second contact connector 401, the third contact connector 403, and the first floating pad 117 are aligned.

By placing the first floating pad 117 between the first contact connector 301 and the second contact connector 401, and by placing the second floating pad 119 between the first contact connector 301 and the third contact connector 403, no additional space is necessary. As such, the first floating pad 117 and the second floating pad 119 may be integrated into the overall array without requiring further design in order to find additional space. As such, an extensive redesign of the array is not necessary to integrate the first floating pad 117 and the second floating pad 119.

Figure 5:
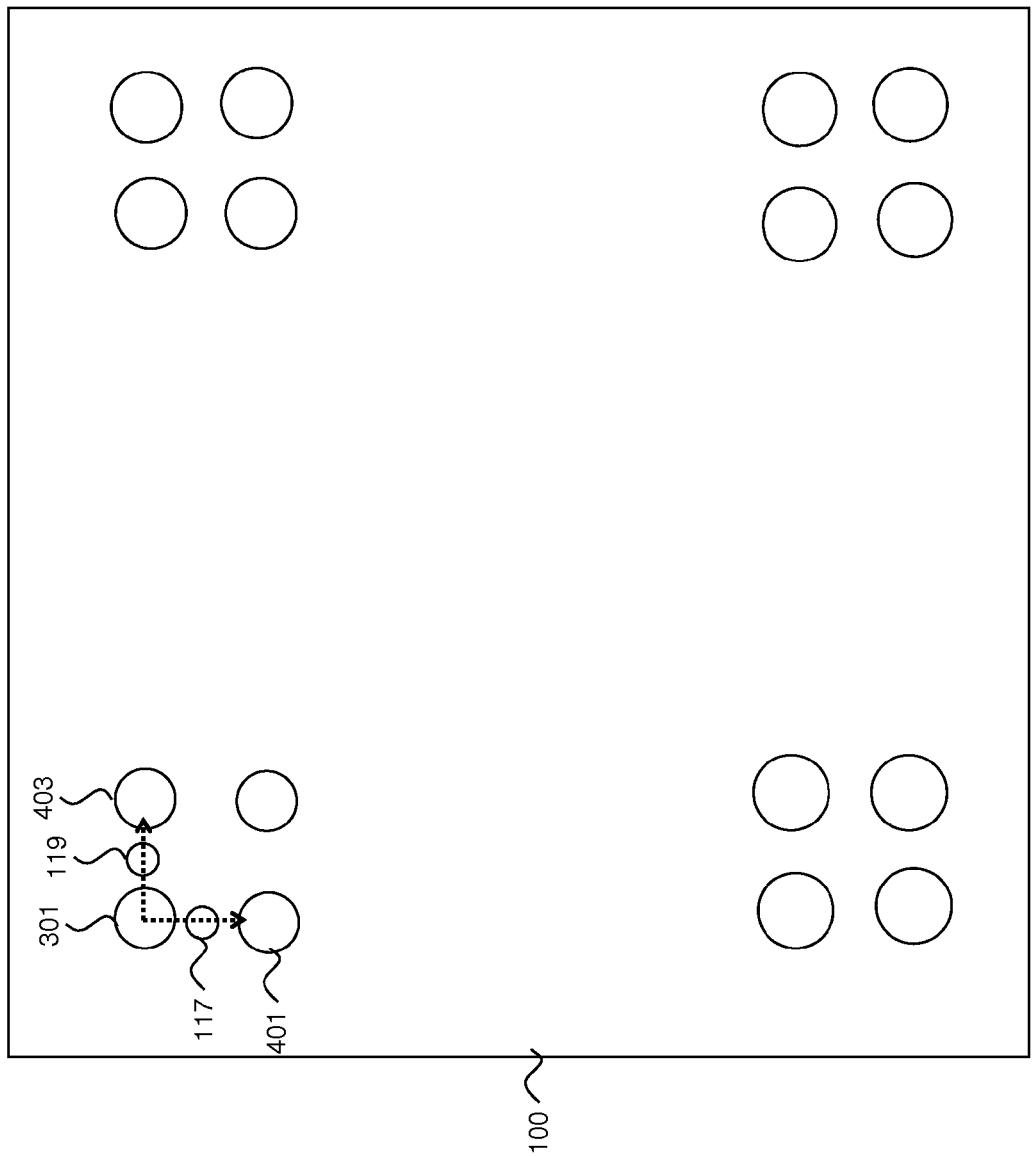
FIG. 5 illustrates a layout of the first contact connection, the first floating pad, and the second floating pad in a non-linear arrangement on the semiconductor die in accordance with an embodiment.

FIG. 5 illustrates another layout in which the first contact connector 301, the second contact connector 401, and the third contact connector 403 are located along a corner of the semiconductor die 100 and, as such, are not aligned along the same direction. In this embodiment the first contact connector 301 may be aligned with the second contact connector 401 along a first direction that is parallel with a first side of the semiconductor die 100, and the first contact connector 301 may be aligned with the third contact connector 403 along a second direction that is parallel with a second side of the semiconductor die 100.

In this embodiment the first floating pad 117 may be located between the first contact connector 301 and the second contact connector 401, while the second floating pad 119 may be placed between the first contact connector 301 and the third contact connector 403. As such, while the first contact connector 301, the first floating pad 117, and the second contact connector 401 may be aligned together along the first direction, and while the first contact connector 301, the second floating pad 119, and the third contact connector 403 may be aligned along the second direction, the first floating pad 117 and the second floating pad 119 are not aligned with the first contact connector 301 in a linear fashion, but are, rather, aligned with the first contact connector 301 perpendicular to each other.

By placing the first floating pad 117 and the second floating pad 119 along perpendicular directions, the first floating pad 117 and the second floating pad 119 may be formed next to the first contact connector 301 when the first contact connector 301 is placed along a corner of the semiconductor die 100. Because the corners of the semiconductor die 100 have a larger stress caused from thermal expansion of the semiconductor die 100 during thermal processing. Such a placement of the first floating pad 117 and the second floating pad 119 allows for testing of the first contact connector 301 when it is located in a corner of the semiconductor die 100 and where a defect has a higher likelihood of occurring.

Figure 6:
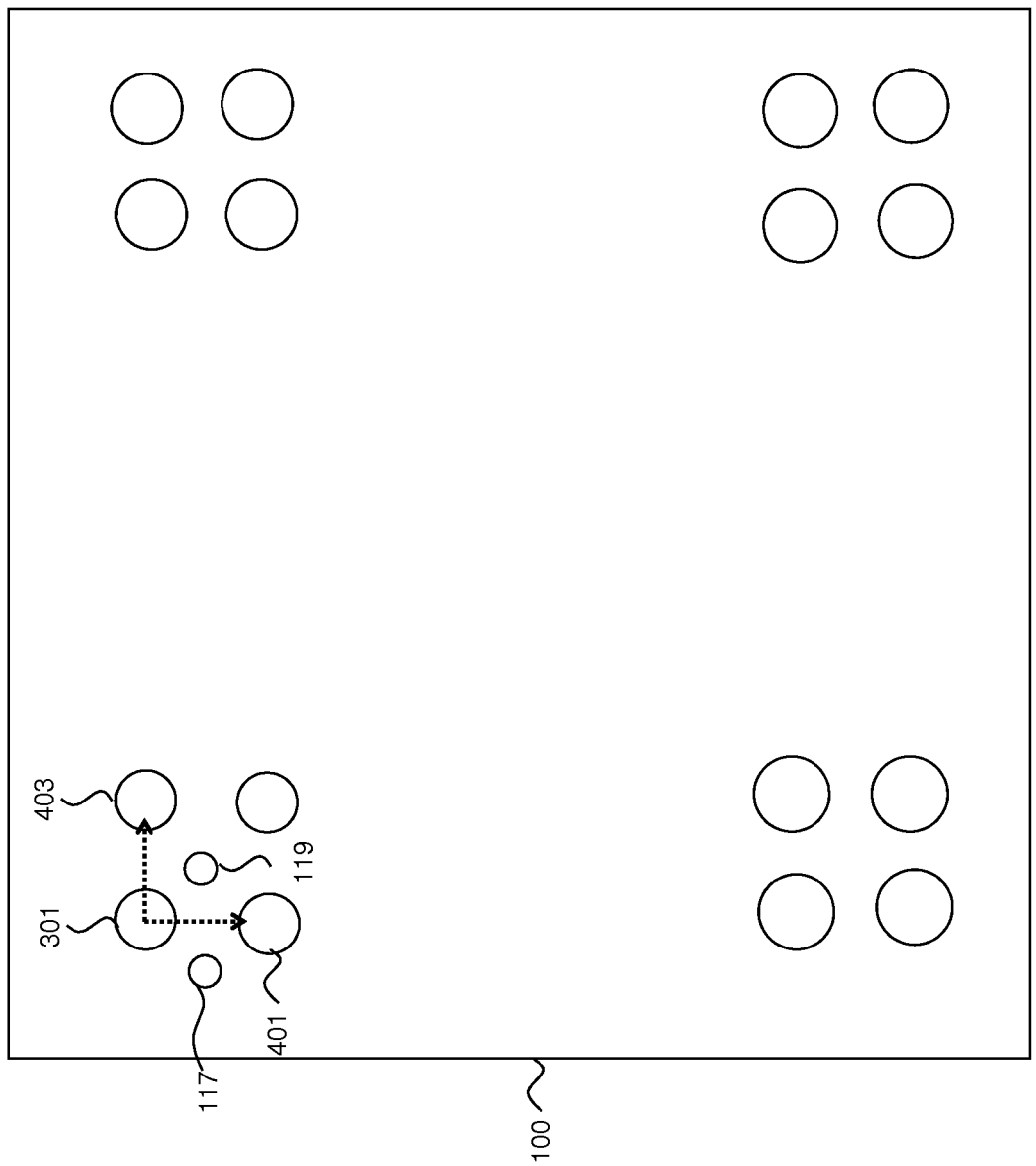
FIG. 6 illustrates a layout of the first contact connection, the first floating pad, and the second floating pad in a non-linear, offset arrangement on the semiconductor die in accordance with an embodiment.

FIG. 6 illustrates yet another embodiment in which the first floating pad 117 and the second floating pad 119 are not placed between the first contact connector 301, the second contact connector 401, and the third contact connector 403. By placing the first floating pad 117 and the second floating pad 119 offset from the second contact connector 401 and the third contact connector 403, more open space may be utilized.

In accordance with an embodiment, a semiconductor device comprising a conductive contact on a substrate, the conductive contact having a first width, is provided. A first floating test pad is adjacent to the conductive contact on the substrate, wherein the first floating test pad is electrically connected to the conductive contact through the substrate, the first floating test pad having a second width that is different than the first width.

In accordance with another embodiment, a semiconductor device comprising a first conductive contact on a substrate and a second conductive contact on the substrate, the second conductive contact being located a first distance from the first conductive contact, is provided. A first test pad is located a second distance from the first conductive contact, the first distance being less than the second distance, the first test pad being smaller than the first conductive contact. An interconnect is within the substrate, the interconnect electrically connecting the first test pad to the first conductive contact.

In accordance with yet another embodiment, a method of manufacturing a semiconductor device comprising forming an interconnect on a substrate and forming a passivation layer over the interconnect is provided. A first opening and a second opening are formed through the passivation layer to expose a first portion of the interconnect and a second portion of the interconnect, and a conductive contact is formed in the first opening in contact with the interconnect. A first test pad is formed in the second opening in contact with the interconnect, the first test pad having a smaller lateral dimension than the conductive contact.

Although the embodiments and their advantages have been described in detail, it should be understood that various changes, substitutions and alterations can be made herein without departing from the spirit and scope of the embodiments as defined by the appended claims. For example, the various processing methods may be altered as desired. Additionally, the precise placement of the floating pads may be adjusted to provide for any desired placement for a particular design.

Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed, that perform substantially the same function or achieve substantially the same result as the corresponding embodiments described herein may be utilized according to the embodiments. Accordingly, the appended claims are intended to include within their scope such processes, machines, manufacture, compositions of matter, means, methods, or steps.

What is claimed is:

1. A semiconductor device comprising:
a conductive contact on a substrate, the conductive contact having a first width;
a first floating test pad adjacent to the conductive contact on the substrate, wherein the first floating test pad is electrically connected to the conductive contact through the substrate, the first floating test pad having a second width that is different than the first width; and
a second floating test pad on the substrate, wherein the second floating test pad is electrically connected to the conductive contact and the first floating test pad through the substrate, the second floating test pad having a third width that is different than the first width, wherein the first floating test pad, the second floating test pad, and the conductive contact form an angle, the angle being at least 90° and comprising a vertex located over the conductive contact.

2. The semiconductor device of claim 1, wherein the angle is about 180°.

3. The semiconductor device of claim 1, wherein the angle is about 90°.

4. The semiconductor device of claim 1, wherein the conductive contact is located at a corner of the substrate.

5. The semiconductor device of claim 1, wherein the conductive contact comprises a first material and the first floating test pad comprises the first material.

6. The semiconductor device of claim 1, further comprising a conductive bump on the conductive contact.

7. The semiconductor device of claim 1, further comprising a post passivation interconnect electrically connecting the first floating pad to the conductive contact through the substrate.

8. A semiconductor device comprising:
a substrate;
a redistribution layer over the substrate;
a conductive contact in electrical connection with the redistribution layer, the conductive contact having a first width;
a first floating pad in electrical connection with the redistribution layer, the first floating pad having a second width different from the first width; and
a second floating pad in electrical connection with the redistribution layer, the second floating pad having a third width different from the first width, wherein the first floating pad, the second floating pad, and the conductive contact form a non-acute triangle.

9. The semiconductor device of claim 8, wherein the first floating pad, the second floating pad, and the conductive contact form an obtuse triangle.

10. The semiconductor device of claim 8, wherein the first floating pad, the second floating pad, and the conductive contact form a right triangle.

11. The semiconductor device of claim 8, wherein the conductive contact is located at a corner of the substrate.

12. The semiconductor device of claim 8, wherein the conductive contact comprises a first material and the first floating pad comprises the first material.

13. A semiconductor device comprising:
a first floating pad over a substrate;
a second floating pad electrically connected to the first floating pad through a redistribution layer; and
a contact in electrical connection with both the first floating pad and the second floating pad through the redistribution layer, wherein the contact has a first width that is larger than a second width of the first floating pad, wherein the contact has a first normal in a first direction and a second normal in a second direction different from the first direction, the first floating pad being aligned with the first normal, the second floating pad being aligned with the second normal.

14. The semiconductor device of claim 13, wherein the first normal and the second normal are on opposite sides of the floating pad.

15. The semiconductor device of claim 13, wherein the first normal and the second normal are perpendicular.

16. The semiconductor device of claim 13, wherein the first floating pad, the second floating pad, and the contact are a same material.

17. The semiconductor device of claim 13, wherein the contact is located in a corner region of the substrate.

18. The semiconductor device of claim 13, wherein the first floating pad and the contact are aligned along a first axis and the second floating pad is laterally removed from the first axis.

* * * * *